United States Patent
Paavola et al.

(10) Patent No.: US 10,932,393 B2
(45) Date of Patent: Feb. 23, 2021

(54) TORSIONAL HEAT PIPE

(71) Applicant: Intel Corporation, Santa Clara, CA (US)

(72) Inventors: Juha Tapani Paavola, Hillsboro, OR (US); Mikko Antero Makinen, San Jose, CA (US); Columbia Mishra, Hillsboro, OR (US); Mark Carbone, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/370,918

(22) Filed: Mar. 30, 2019

(65) Prior Publication Data

US 2019/0254194 A1 Aug. 15, 2019

(51) Int. Cl.
*H05K 7/20* (2006.01)
*F28D 15/02* (2006.01)
*G06F 1/20* (2006.01)

(52) U.S. Cl.
CPC ..... *H05K 7/20336* (2013.01); *F28D 15/0208* (2013.01); *G06F 1/20* (2013.01); *F28D 2015/0216* (2013.01); *F28F 2230/00* (2013.01)

(58) Field of Classification Search
CPC ........... H05K 7/20336; H05K 7/20663; H05K 7/2099; G06F 1/20; G06F 1/1616; G06F 1/203; F28D 15/0208; F28D 2015/0216; F28F 2230/00; F28F 2280/10; H01L 23/427
USPC ....................................... 361/679.47, 679.52
See application file for complete search history.

(56) References Cited

U.S. PATENT DOCUMENTS

| 3,801,843 | A | * | 4/1974 | Corman | ............... F28D 15/0275 310/52 |
| 5,621,613 | A | * | 4/1997 | Haley | ..................... G06F 1/203 165/104.33 |
| 5,646,822 | A | * | 7/1997 | Bhatia | ..................... F28D 15/02 165/104.33 |
| 5,847,925 | A | * | 12/1998 | Progl | ..................... G06F 1/203 361/679.47 |

(Continued)

FOREIGN PATENT DOCUMENTS

WO    WO-2017052590 A1 *  3/2017  ......... E05D 11/0081

OTHER PUBLICATIONS

Ghosh Prosenjit; Larsen Denica; Okuley James; Wong Hong, "Hinge for an Electronic Device", Mar. 30, 2017, Entire Document (Translation of WO2017052590). (Year: 2017).*

*Primary Examiner* — Stephen S Sul
(74) *Attorney, Agent, or Firm* — Patent Capital Group (57) ABSTRACT

Particular embodiments described herein provide for an electronic device that can be configured to include a torsional heat pipe. The torsional heat pipe can include a first housing static portion located in a first housing of an electronic device, where the first housing static portion is coupled to a heat source, a second housing static portion located in a second housing of the electronic device, where the second housing static portion is coupled to a heat spreader, and a torsion portion located in a hinge of the electronic device, where the hinge rotatably couples the first housing to the second housing and the torsion portion rotates as the second housing rotates relative to the first housing and the torsion portion couples the first housing static portion to the second housing static portion.

20 Claims, 11 Drawing Sheets

(56) References Cited

U.S. PATENT DOCUMENTS

| | | | | |
|---|---|---|---|---|
| 5,910,883 A * | 6/1999 | Cipolla | ............... | F28D 15/0233 |
| | | | | 165/104.33 |
| 5,946,187 A * | 8/1999 | Cipolla | ................... | G06F 1/203 |
| | | | | 16/371 |
| 6,031,716 A * | 2/2000 | Cipolla | ................... | G06F 1/203 |
| | | | | 165/104.33 |
| 6,172,871 B1 * | 1/2001 | Holung | ................. | G06F 1/1632 |
| | | | | 165/104.33 |
| 6,175,493 B1 * | 1/2001 | Gold | ....................... | G06F 1/203 |
| | | | | 174/15.2 |
| 6,253,836 B1 * | 7/2001 | Mitchell | ............. | F28D 15/0233 |
| | | | | 165/104.33 |
| 6,288,896 B1 * | 9/2001 | Hsu | ......................... | G06F 1/182 |
| | | | | 165/104.33 |
| 6,507,488 B1 * | 1/2003 | Cipolla | ................... | G06F 1/203 |
| | | | | 165/104.33 |
| 7,791,876 B2 * | 9/2010 | Moore | .................... | G06F 1/203 |
| | | | | 16/221 |
| 10,156,402 B1 * | 12/2018 | Carlson | ................... | F28D 15/02 |
| 2004/0080908 A1 * | 4/2004 | Wang | ...................... | G06F 1/203 |
| | | | | 361/679.47 |
| 2009/0071632 A1 * | 3/2009 | Bryant | ................ | F28D 15/0241 |
| | | | | 165/104.26 |
| 2010/0091450 A1 * | 4/2010 | Hung | .................... | G06F 1/1616 |
| | | | | 361/679.52 |
| 2011/0067844 A1 * | 3/2011 | Meyer, IV | .......... | F28D 15/0233 |
| | | | | 165/104.26 |

* cited by examiner

FIG. 11

TORSIONAL HEAT PIPE

TECHNICAL FIELD

This disclosure relates in general to the field of computing and/or device cooling, and more particularly, to a torsional heat pipe.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a torsional heat pipe. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents. For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. The term "coupled" may mean one or more of the following. The term "coupled" may mean that two or more elements are in direct physical or electrical contact. However, the term "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Figure 1A:
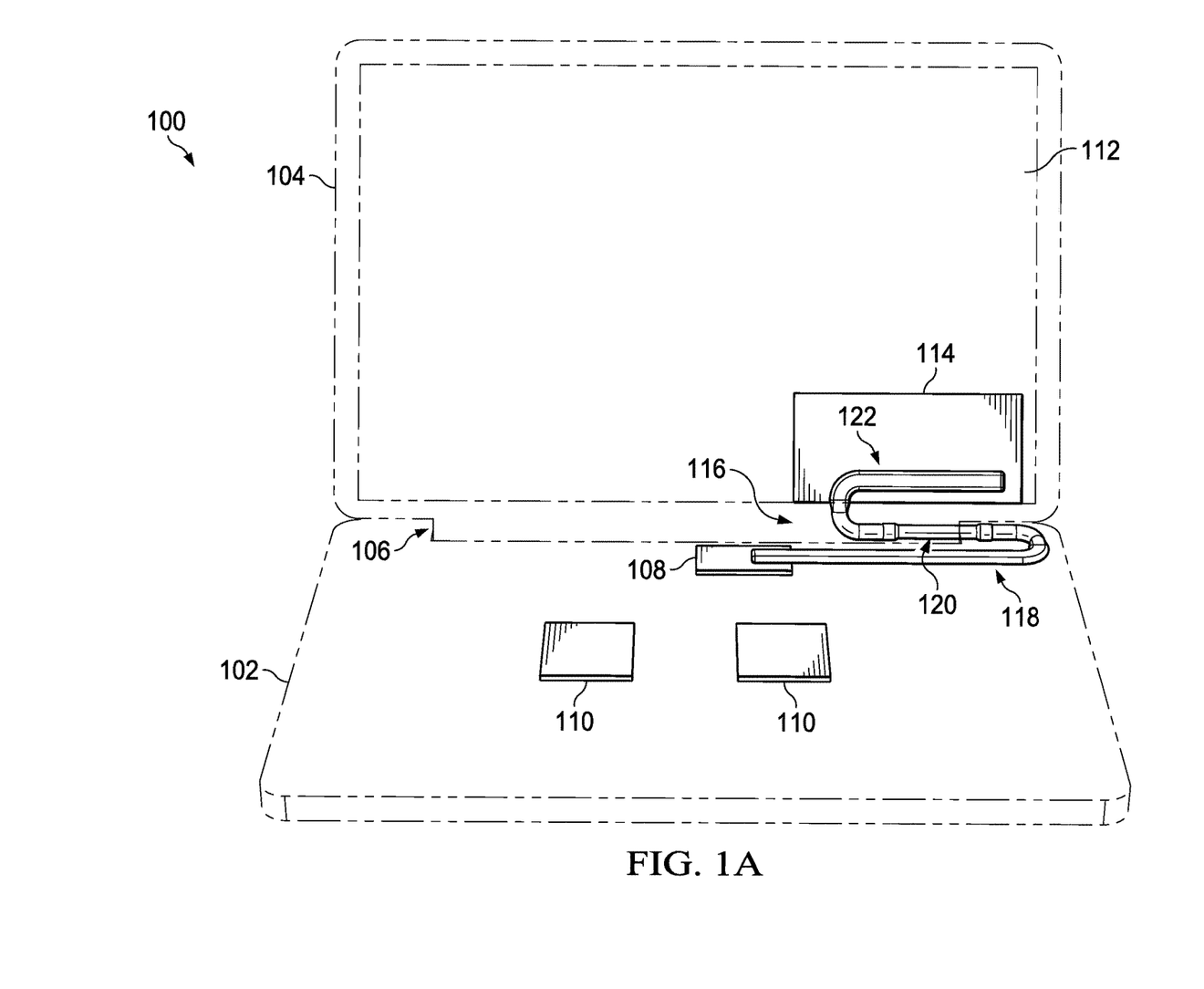
FIG. 1A is a simplified block diagram of a system to enable a torsional heat pipe, in accordance with an embodiment of the present disclosure.
Figure 1B:
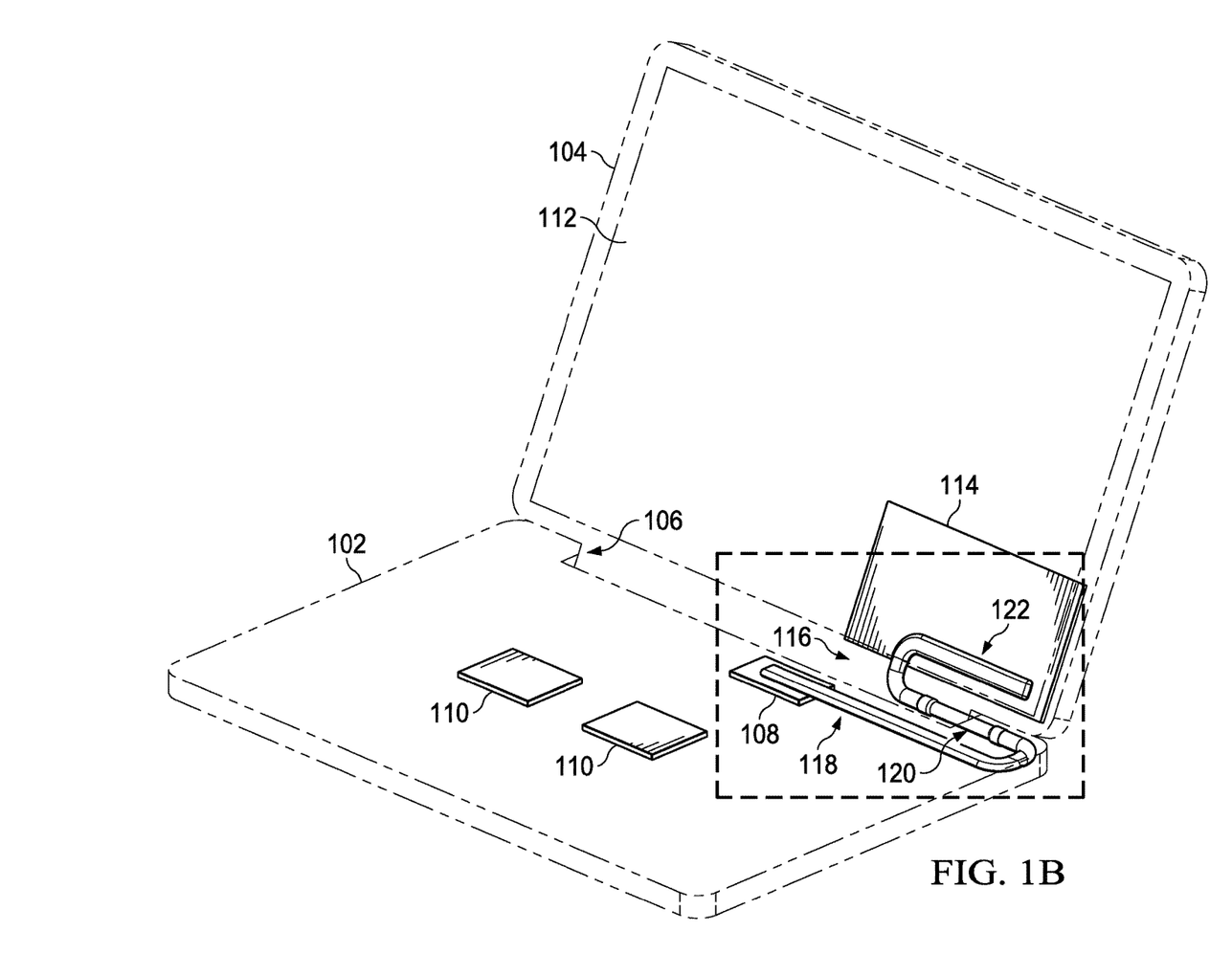
FIG. 1B is a simplified block diagram of a system to enable a torsional heat pipe, in accordance with an embodiment of the present disclosure.

FIG. 1 is a simplified block diagram of an electronic device configured with a torsional heat pipe, in accordance with an embodiment of the present disclosure. In an example, an electronic device 100 can include a first housing 102 and a second housing 104. First housing 102 can be rotationally coupled to second housing 104 using hinge 106. First housing 102 can include a heat source 108 and electronics 110. Second housing 104 can include a display 112 and heat spreader 114. In an example, a torsional heat pipe 116 can extend from heat source 108, through hinge 106, and to heat spreader 114. Torsional heat pipe 116 can include a first housing static portion 118, a rotatable torsion portion 120, and a second housing static portion 122.

When second housing 104 is rotated on hinge 106 relative to first housing 102, torsion portion 120 rotates to allow torsional heat pipe 116 to be a continuous heat pipe chamber to transfer heat from heat source 108, through hinge 106, and to heat spreader 114. In an example, when second housing 104 is rotated on hinge 106 relative to first housing 102, torsion portion 120 may be made of a material that allows the torsional stress field in torsion portion 120 to be a relatively uniform stress/strain field under torsion. In another example, when second housing 104 is rotated on hinge 106 relative to first housing 102, torsion portion 120 may be made of a material that will not uniformly deform but rather will buckle into striations to allow the bending or buckling of torsion portion 120. In an example, torsional heat pipe 116 can be a sealed vapor chamber where the same vapor travels from first housing 102, through hinge 106, to second housing 104, where the vapor spreads through heat spreader 114 to help cool heat source 108. Torsional heat pipe 116 can have an outside diameter between about two (2) millimeters (mm) to about twelve (12) mm. In other examples torsional heat pipe 116 can have an outside diameter of about 1.4 mm, about ten (10) mm, about three (3) mm to about (8) mm, or some other diameter that allows torsional heat pipe 116 to be a continuous heat pipe chamber to transfer heat from heat source 108, through hinge 106, and to heat spreader 114.

Heat source 108 may be a heat generating device (e.g., processor, logic unit, field programmable gate array (FPGA), chip set, integrated circuit (IC), a graphics processor, graphics card, battery, memory, or some other type of heat generating device). Heat spreader 114 can be configured as a thermal cooling device to help remove thermal energy from one or more heat sources. Heat spreader 114 may be a passive cooling device or an active cooling device to help to reduce the thermal energy or temperature of one or more corresponding heat sources. In addition, first housing 102 may include one or more passive cooling devices and/or active cooling devices (not shown) to help remove thermal energy from one or more heat sources in first housing 102. The one or more passive cooling devices and/or active cooling devices in first housing 102 may be independent of heat spreader 114 or may function in concert with heat spreader 114. Each of electronics 110 can be a device or group of devices available to assist in the operation or function of the electronic device that includes electronics 110.

In an example, torsional heat pipe 116 can be configured to go through hinge 106 and transfer the heat from heat source 108 in first housing 102 to heat spreader 114 in second housing 104 where there is more surface area and the increased surface area can provide better cooling. More specifically, transferring the heat from heat source 108 in first housing 102 to heat spreader 114 in second housing 104 allows for more area to transfer heat to the environment and away from electronic device 100.

In an example, torsional heat pipe 116 can enable a 2-phase (e.g., liquid/gas or water/steam) heat transfer of at least a portion of heat from a heat source (e.g., computer processing unit (CPU), graphics processing unit (GPS), etc.) in a base (e.g., first housing 102) of a clamshell computer across a hinge (e.g., hinge 106) of the clamshell computer to a heat spreader (e.g., heat spreader 114) in a lid (e.g., second housing 104) of the clamshell computer. The lid can be used for heat dissipation because it has a large surface area and it is often nearly vertical during use. Transferring heat with low resistance from the base to the lid, optionally with the 2-phase heat transfer spreading across the lid, enables higher performance from the heat source and/or a quieter thinner system than current designs.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

For example, in some devices, it can be difficult to cool one or more heat sources, especially when the heat sources are relatively close together and/or are located inside a relatively crowded housing that includes memory, processors, battery, etc. The relatively crowded housing can make it difficult to locate thermal solutions inside the crowded housing. In addition, typically the crowded housing acts as a base and is against a flat surface such as a table so it can be difficult to facilitate the movement of air inside the base and dissipate heat from a heat source. One solution is to transfer the heat from the crowded housing to a housing that is not crowded. For example, transferring heat from a base of a laptop to the lid provides more area to reject the heat to the environment. However, the base is typically coupled to the lid using a hinge and to transfer the heat from the base to the lid, the heat transfer device needs to go through the hinge.

Some current systems attempt to address the issue by using a piece of graphite that is used to go from the base to the lid. However, thermal conductance of the graphite is typically not very high as the low cross-sectional area of graphite makes its conductance of thermal energy relatively low, there is a temperature gradient along the length of the graphite, and the total heat transferred to the lid is often insufficient. Other current systems may use a rigid heat pipe as the pin of a system hinge where the system attempts to transfer the heat across the gap between the heat pipe pin and an inner surface of the hinge cylinder. However, with this system, a sliding surface between the heat pipe pin and outer portion of the hinge is required and there is typically a high thermal resistance across the sliding surface. Still other current systems may use a flexible heat pipe where the lid is connected to the base by a flexible heat pipe that is perpendicular to the hinge axis. However, a flexible heat pipe requires a relatively large bend radius to avoid failure. Typically, the minimum bend radius is twenty-five (25) millimeters (mm) and hinged devices often experience a full deflection of approximately one hundred and fifty (150) degrees, which results in tight bend radius for the heat pipe where strains are concentrated on the bending area of the heat pipe. The tight bend radius can cause reliability problems and will often fail under fatigue loading. Further, a flexible heat pipe is not suitable for thin clamshell solutions, because for thick clamshell systems, the bending radius should be less than ten (10) mm while the minimum bend radius for a flexible heat pipe is typically greater than twenty-five (25) mm. In addition, the large bend radius of the flexible heat pipe can make the system odd-shaped. What is needed is a heat pipe that can transfer heat from one housing to another housing across a hinge area.

A system to enable a torsional heat pipe, as outlined in FIG. 1, can resolve these issues (and others). In an example, a torsional heat pipe (e.g., torsional heat pipe 116) can be configured to include a flexible and rotatable torsion portion (e.g., torsion portion 120) in the torsional heat pipe at the hinge region where the torsional heat pipe will experience torsion. This allows the torsional heat pipe to deform in the hinge area and can help to reduce stress on the torsional heat pipe. The torsion portion is configured to load the torsional heat pipe in torsion rather than bending to enable the torsional heat pipe to be cycled multiple times without failure. In addition, in one embodiment, the torsional heat pipe stress field in the torsion portion is a relatively uniform stress/strain field under torsion. In another embodiment, the torsion portion of the torsional heat pipe may be made of a material (e.g., copolymer coated fiberglass sleeving) that will not uniformly deform but rather will buckle into striations to allow the rotation or bending of torsional heat pipe in the hinge area.

One end of the torsional heat pipe can be coupled to a heat source in a first housing of an electronic device and the other end of the torsional heat pipe can be coupled to a solid heat spreader in a second housing of the electronic device. The torsion portion of the torsional heat pipe can be in the hinge mechanism that rotatably couples the first housing to the second housing. A vapor space from the torsional heat pipe can be continued to a vapor chamber such that vapor can travel all the way from the heat source in the first housing to the heat spreader in the second housing, resulting in relatively low resistance heat transfer.

The material of the torsion portion of the torsional heat pipe can have a low modulus to prevent too high of a torque moment and can have a hermetic seal or quasi-hermetic seal at least for 45,000 hours. More specifically, the material for the torsion portion of the torsional heat pipe can include, for example, a polyurethane or similar material. In another specific example, the inner surface of the torsion portion of the torsional heat pipe can be sealed with a rubber tube and a coating. Heat pipes typically have a hermetic seal to isolate the internal water vapor from the environment. While a perfectly hermetic seal is difficult to obtain, the torsional heat pipe can transfer thermal energy from the first housing, through the hinge, and to the second housing with a hermetic or quasi-hermetic seal. For example, some polymer sealants make possible quasi-hermetic seals in environments with low gas pressures. In some examples, an elastomer tube can be coated with a polymer sealant to create the hermetic or quasi-hermetic seal.

Because the torsional heat pipe can transfer thermal energy from a heat source in the first housing to a heat spreader in the second housing, the system design can be fanless (passive cooling for higher power CPUs), resulting a silent system potentially with more battery space. The system can also be quieter by rejecting heat passively from the second housing rather than a fan running at a high volume flow rate in the first housing. That is, improved acoustics can be realized either through lower fan speeds or a fanless system. Further, by using a large surface area in the second housing the system is able to dissipate more heat from the heat source which can allow for higher powered devices that tend to generate greater thermal energy or heat. The torsional heat pipe can improve user experience through higher performance, better acoustics, and lower chassis temperatures and can allow system designers the flexibility to use higher power devices, with full performance, in thinner quieter systems. In an example, the first housing may include one or more passive cooling devices and/or active cooling devices to help remove thermal energy from one or more heat sources in the first housing. In a specific example, forced air cooling may be used in the first housing while a passive heat spreader may be used in the second housing. The one or more passive cooling devices and/or active cooling devices in the first housing may be independent of the heat spreader in the second housing or may function in concert with the heat spreader in the second housing.

In an example implementation, electronic device 100, is meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a heat source and a hinge. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic devices 100 can include memory elements for storing information to be used in operations. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

Additionally, heat source 108 may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
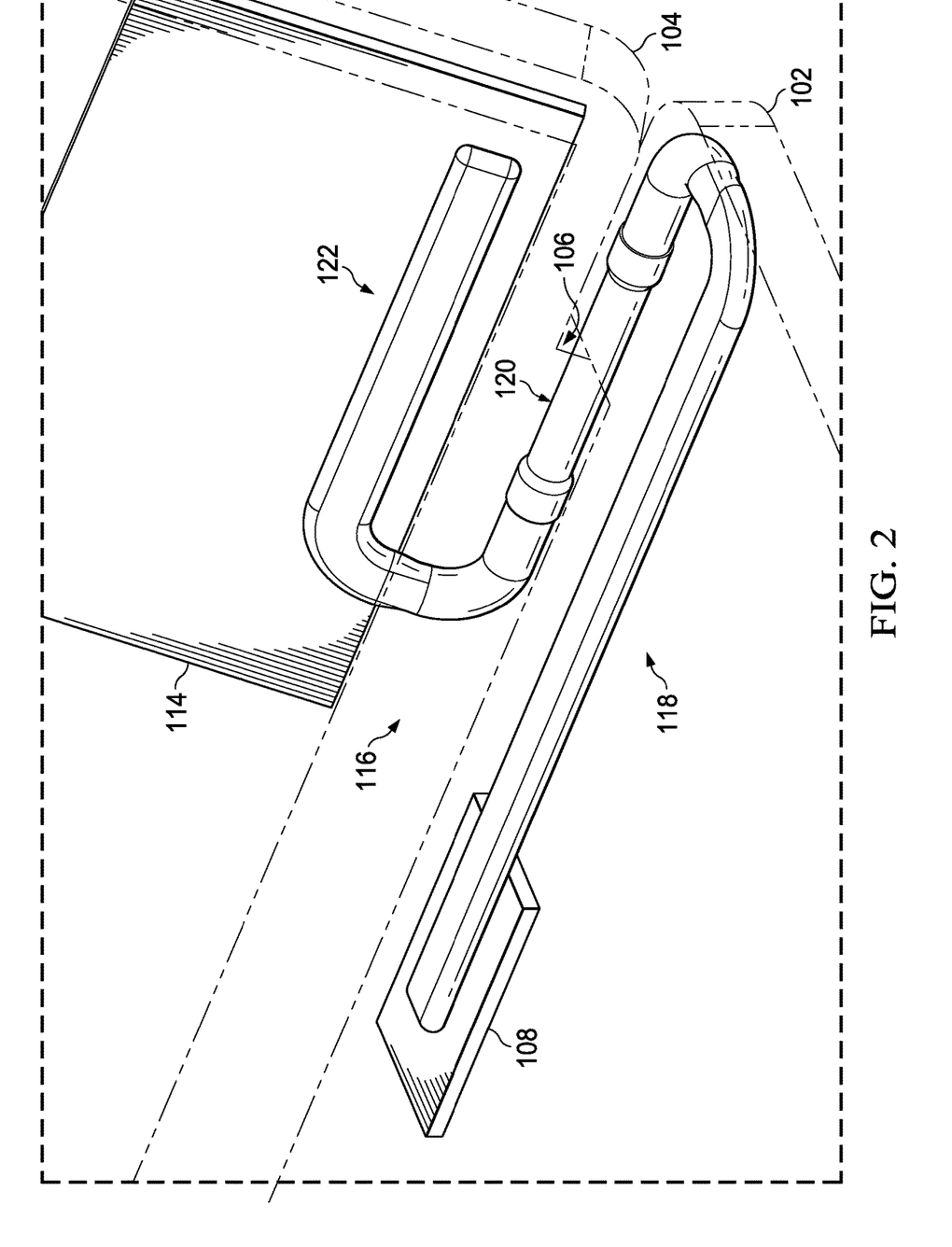
FIG. 2 is a simplified block diagram of a partial view of a system to enable a torsional heat pipe, in accordance with an embodiment of the present disclosure.

Turning to FIG. 2, FIG. 2 is a simplified block diagram of torsional heat pipe 116. Torsion portion 120 of torsional heat pipe 116 can be embedded in hinge 106. Heat spreader 114 can be located behind display 112 (not shown) and may extend across a relatively large portion of second housing 104 (e.g., at least half, more than half, seventy-five percent (75%), etc.). First housing static portion 118 and second housing static portion 122 can be Copper tubes. Torsion portion 120 can be a hermetic or quasi-hermetic flexible segment that allows for deformation when second housing 104 is rotated on hinge 106 relative to first housing 102. In another example, first housing static portion 118 and second housing static portion 122 can overlap each other and an elastomeric tube can span torsion portion 120 which would include the overlap region.

Figure 3:
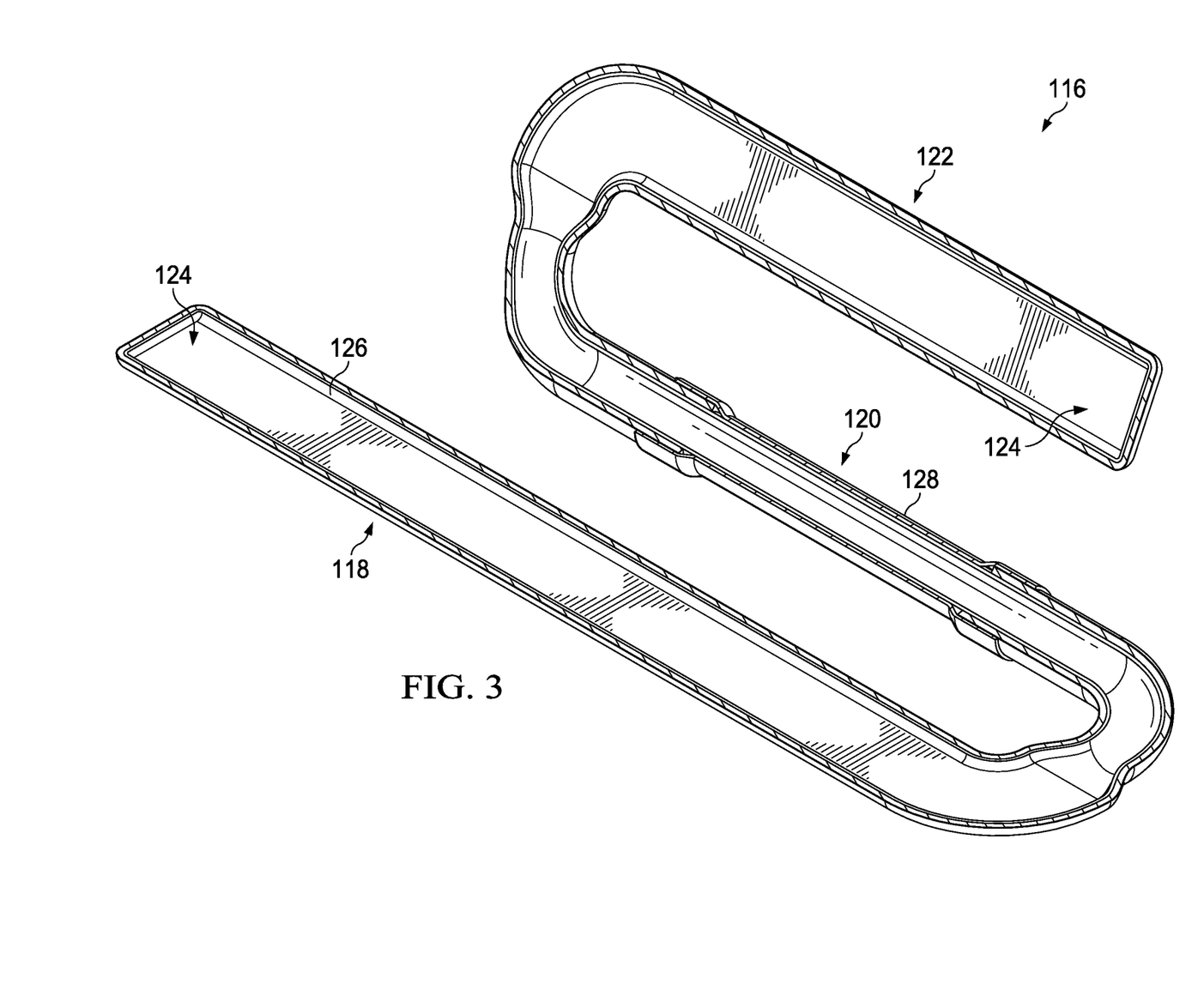
FIG. 3 is a simplified block diagram of a partial view of a torsional heat pipe, in accordance with an embodiment of the present disclosure.

Turning to FIG. 3, FIG. 3 is a simplified block diagram of a cross section of torsional heat pipe 116. Torsional heat pipe 116 can include first housing static portion 118, torsion portion 120, and second housing static portion 122. A vapor flow channel 124 can extend from an end of first housing static portion 118 to an end of second housing static portion 122 to allow vapor to flow through torsional heat pipe 116. A fluid chamber 126 can surround vapor flow channel 124 and allow fluid to flow through torsional heat pipe 116. In an example, fluid chamber 126 may be or contain a heat pipe wick or fiber wick or some other material that can convey the liquid continuously and is able to twist or rotate as torsion portion 120 of torsional heat pipe 116 twists or rotates. A flexible cover 128 can extend over torsion portion 120 of torsional heat pipe 116 and over a portion of first housing static portion 118 and second housing static portion 122 to hermetically seal or quasi-hermetically seal torsion portion 120. Flexible cover 128 can allow torsion portion 120 to rotate with hinge 106 (not shown) and may be an elastomer cover.

In a specific example, the material for fluid chamber 126 of torsional heat pipe 116 can be a braided fiberglass tubing coated with a crosslinked, modified acrylic copolymer that is flexible yet abrasion resistant. Since the glass matrix fibers of the fiberglass tubing will absorb liquid, the initial charge of torsional heat pipe 116 must be increased by the amount of liquid that will be absorbed. Fiberglass tubing can also be highly resistant to refrigerants, enabling 2-phase systems utilizing refrigerant working fluid (e.g., R-134A). The structure of the fiberglass tubing can help to stop fluid chamber 126 from collapsing.

Figure 4:
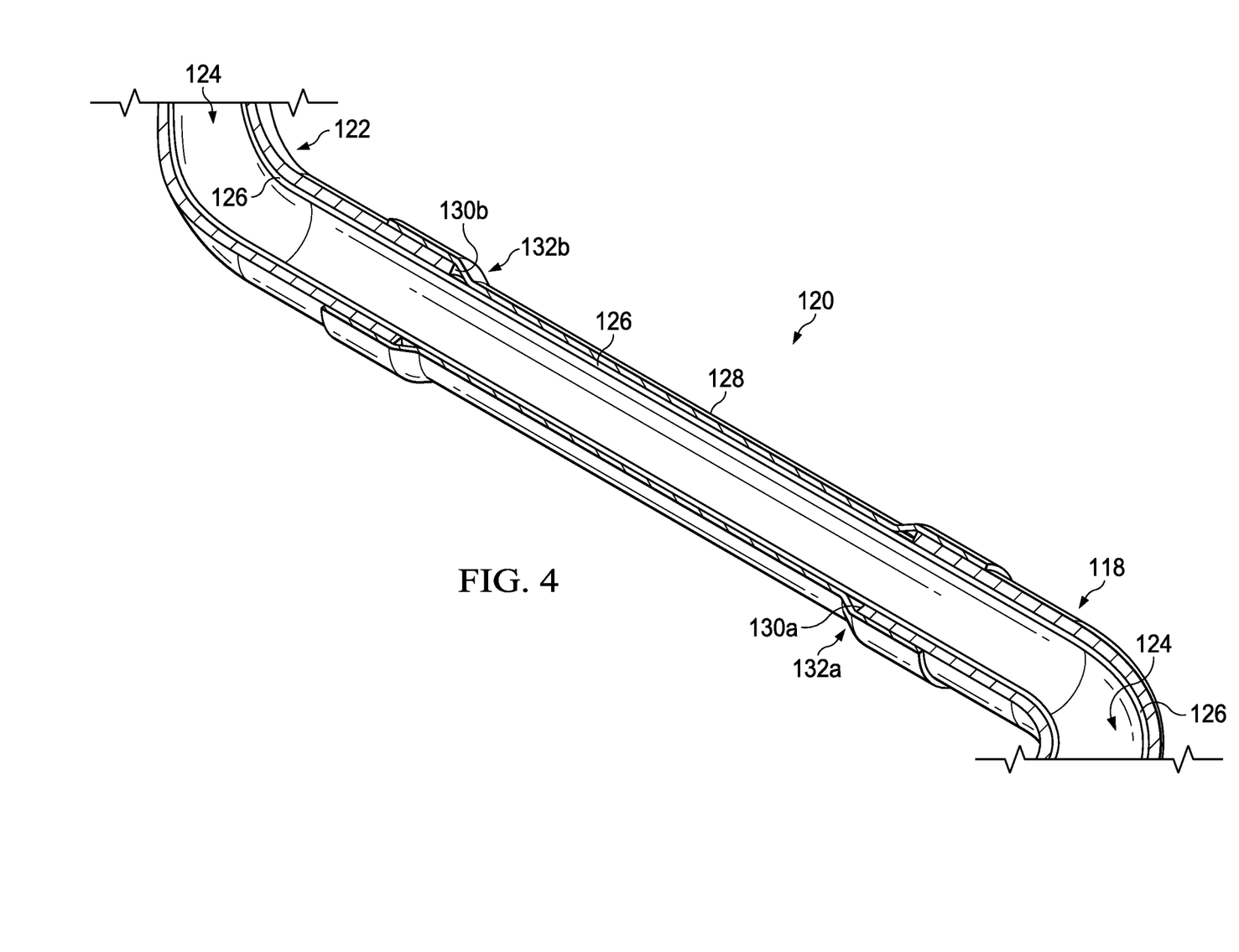
FIG. 4 is a simplified block diagram of a partial view of a torsional heat pipe, in accordance with an embodiment of the present disclosure.

Turning to FIG. 4, FIG. 4 is a simplified block diagram of a portion of a cross section of torsional heat pipe 116. In an example, at a terminating end 130a of first housing static portion 118, flexible cover 128 may have a flare 132a that extends over terminating end 130a of first housing static portion 118. In addition, at a terminating end 130b of second housing static portion 122, flexible cover 128 may have a flare 132b that extends over terminating end 130b of second housing static portion 122. Flare 132a and 132b can help hermetically seal or quasi-hermetically seal torsion portion 120 of torsional heat pipe 116.

In an example, torsion portion 120 can be joined to first housing static portion 118 and second housing static portion 122 by traditional use of an internal ferrule and outer clamping device. Fluid chamber 126 can pass through torsion portion 120 and fluid chamber 126 may be or contain a wire bundle wick, a screen wick, or some other type of material that can convey liquid. In an example, torsion portion 120 can be coated in a material (e.g., titanium, nitinol, or some other material) to hermetically or quasi-hermetically seal torsion portion 120 and allow for torsional heat pipe 116 to be a continuous vapor chamber. In another example, flares 132a and 132b can be coated in a material (e.g., titanium, nitinol, or some other material) to hermetically seal or quasi-hermetically seal torsion portion 120 at terminating end 130a of first housing static portion 118 and at terminating end 130b of second housing static portion 122 and allow for torsional heat pipe 116 to be a continuous vapor chamber.

Figure 5:
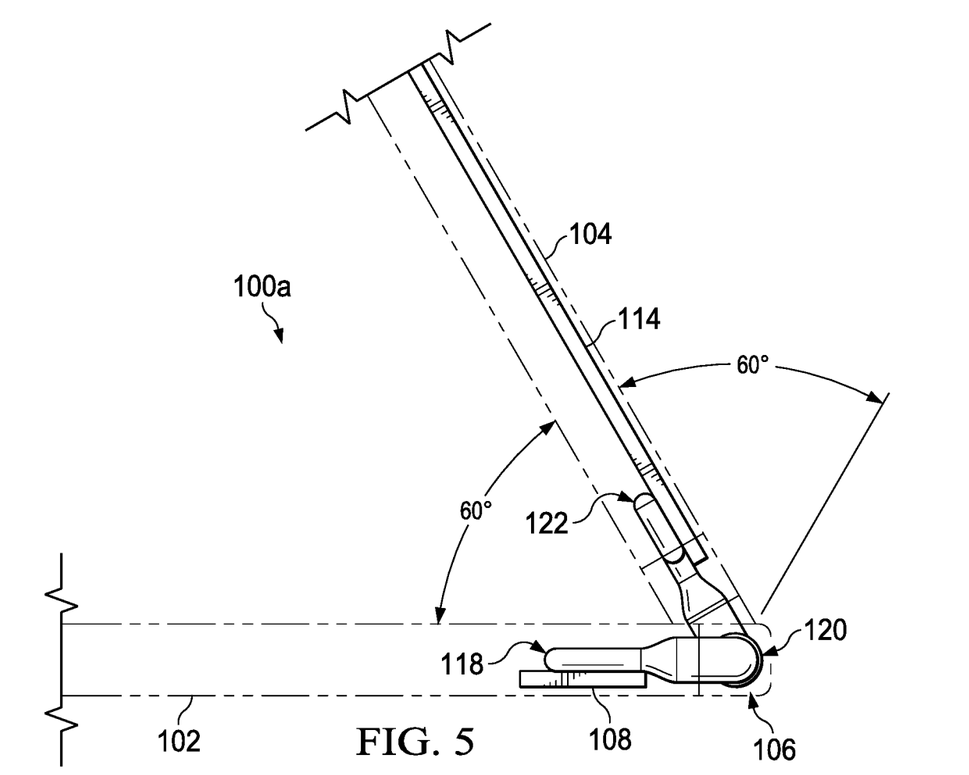
FIG. 5 is a simplified block diagram of a system to enable a torsional heat pipe, in accordance with an embodiment of the present disclosure.

Turning to FIG. 5, FIG. 5 is a simplified block diagram illustrating the rotation of second housing 104 relative to first housing 102. In an example, second housing 104 can have a first position that is partially open relative to first housing 102 where torsion portion 120 of torsional heat pipe 116 does not experience any torsion. Second housing 104 can be rotated about sixty (60) degrees in a first direction relative to first housing 102 to a closed laptop configuration and about sixty (60) degrees in an opposite second direction to an open laptop configuration relative to first housing 102 for a full one hundred and twenty (120) degrees of rotation. Torsion portion 120 can be comprised of a material that allows for the sixty degrees of rotation in the first direction and in the second direction. More specifically, torsion portion 120 can be comprised of a titanium material, a nitinol material, or some other material that will allow for the sixty degrees of rotation in the first direction and in the second direction without compromising the hermetic or quasi-hermetic seal of torsion portion 120 or torsional heat pipe 116.

Figure 6:
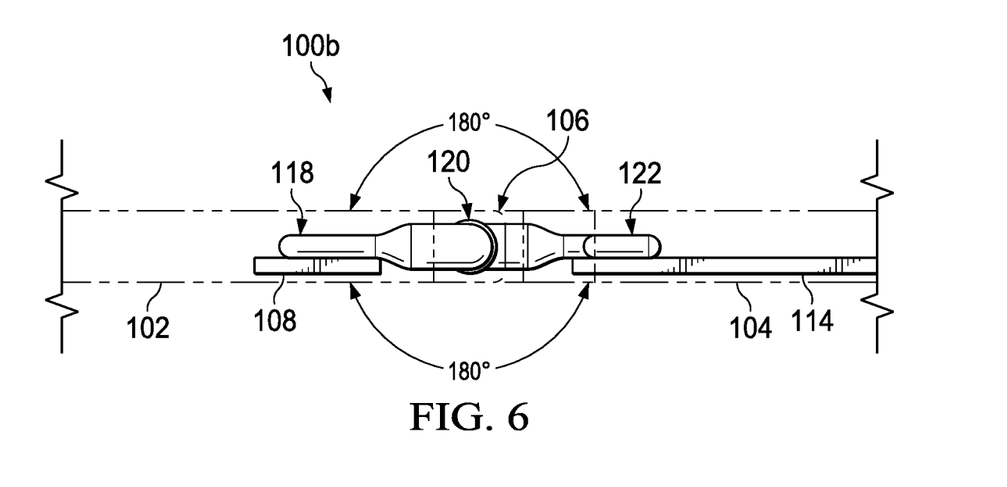
FIG. 6 is a simplified block diagram of a system to enable a torsional heat pipe, in accordance with an embodiment of the present disclosure.

Turning to FIG. 6, FIG. 6 is a simplified block diagram illustrating the rotation of second housing 104 relative to first housing 102. In an example, second housing 104 can have a first position that is relatively flat relative to first housing 102 where torsion portion 120 of torsional heat pipe 116 does not experience any torsion. Second housing 104 can be rotated about one hundred and eighty degrees in a first direction relative to first housing 102 to a closed laptop configuration and about one hundred and eighty degrees in an opposite second direction to a tablet configuration relative to first housing 102. Torsion portion 120 can be comprised of a material that allows for the one hundred and eighty degrees of rotation in the first direction and in the second direction. More specifically, torsion portion 120 can be comprised of a titanium material, a nitinol material, or some other material that will allow for the one hundred and eighty degrees of rotation in the first direction and in the second direction without compromising the hermetic or quasi-hermetic seal of torsion portion 120 or torsional heat pipe 116. The angles of rotation illustrated in FIGS. 5 and 6 are for illustration purposes and generally, the larger the angle of rotation, the longer torsion portion 120 should be to help spread the torsional forces from the rotation.

Figure 7:
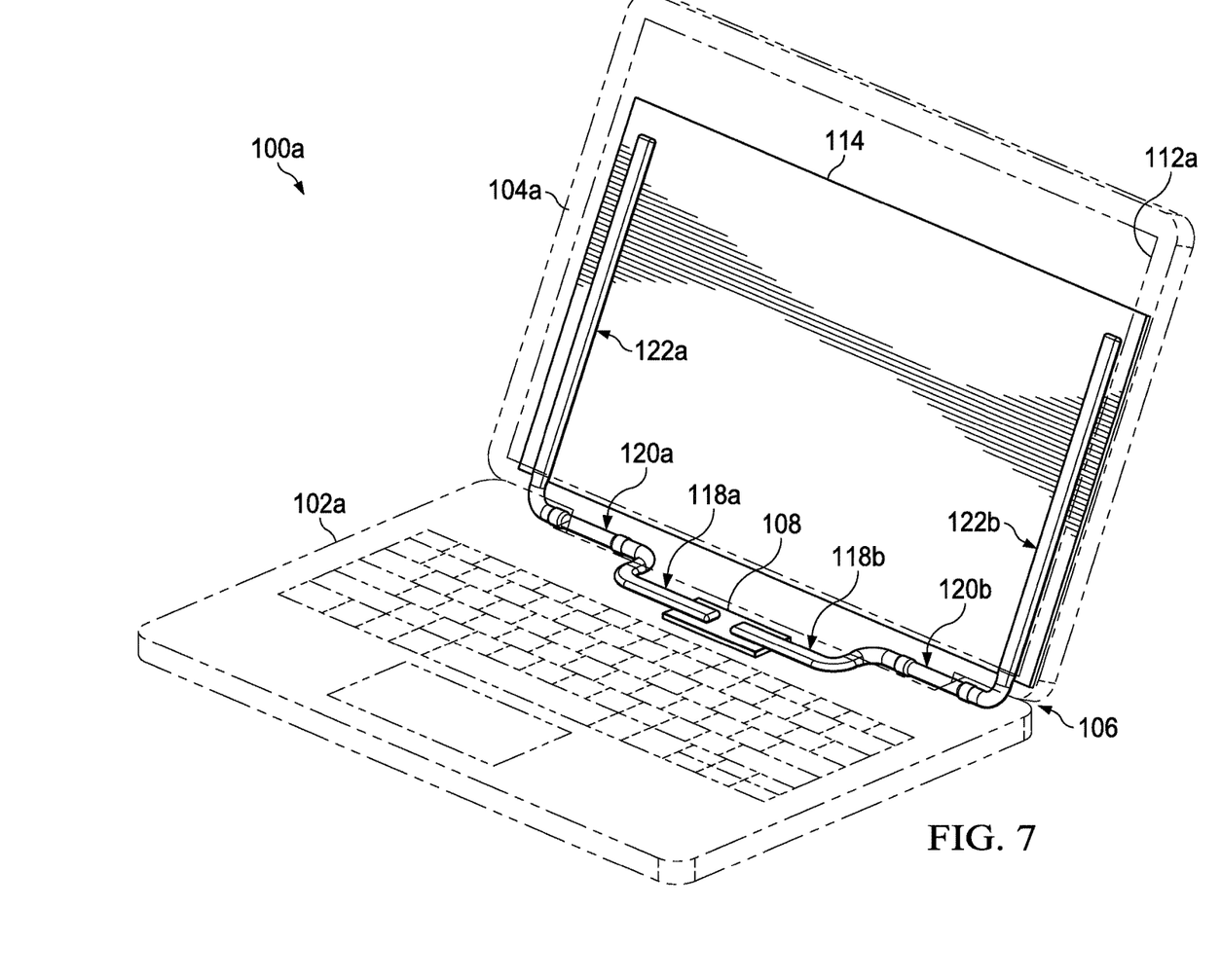
FIG. 7 is a simplified block diagram of a system to enable a torsional heat pipe, in accordance with an embodiment of the present disclosure.

Turning to FIG. 7, FIG. 7 is a simplified block diagram of a portion of an electronic device 100a that includes two torsional heat pipes. As illustrated in FIG. 7, electronic device 100a can include a first housing 102a and a second housing 104a. First housing 102a can be rotationally coupled to second housing 104a using hinge 106. First housing 102a can include a heat source 108. Second housing 104 can include display 112 and heat spreader 114. In an example, a first housing first static portion 118a can extend from heat source 108, to first torsion portion 120a in hinge 106, to second housing first static portion 122a, and to heat spreader 114 with a continuous vapor space from first housing first static portion 118a, through first torsion portion 120a, through second housing first static portion 122a, and to heat spreader 114. In addition, a first housing second static portion 118b can extend from heat source 108, to second torsion portion 120b in hinge 106, to second housing second static portion 122b, and to heat spreader 114.

Figure 8:
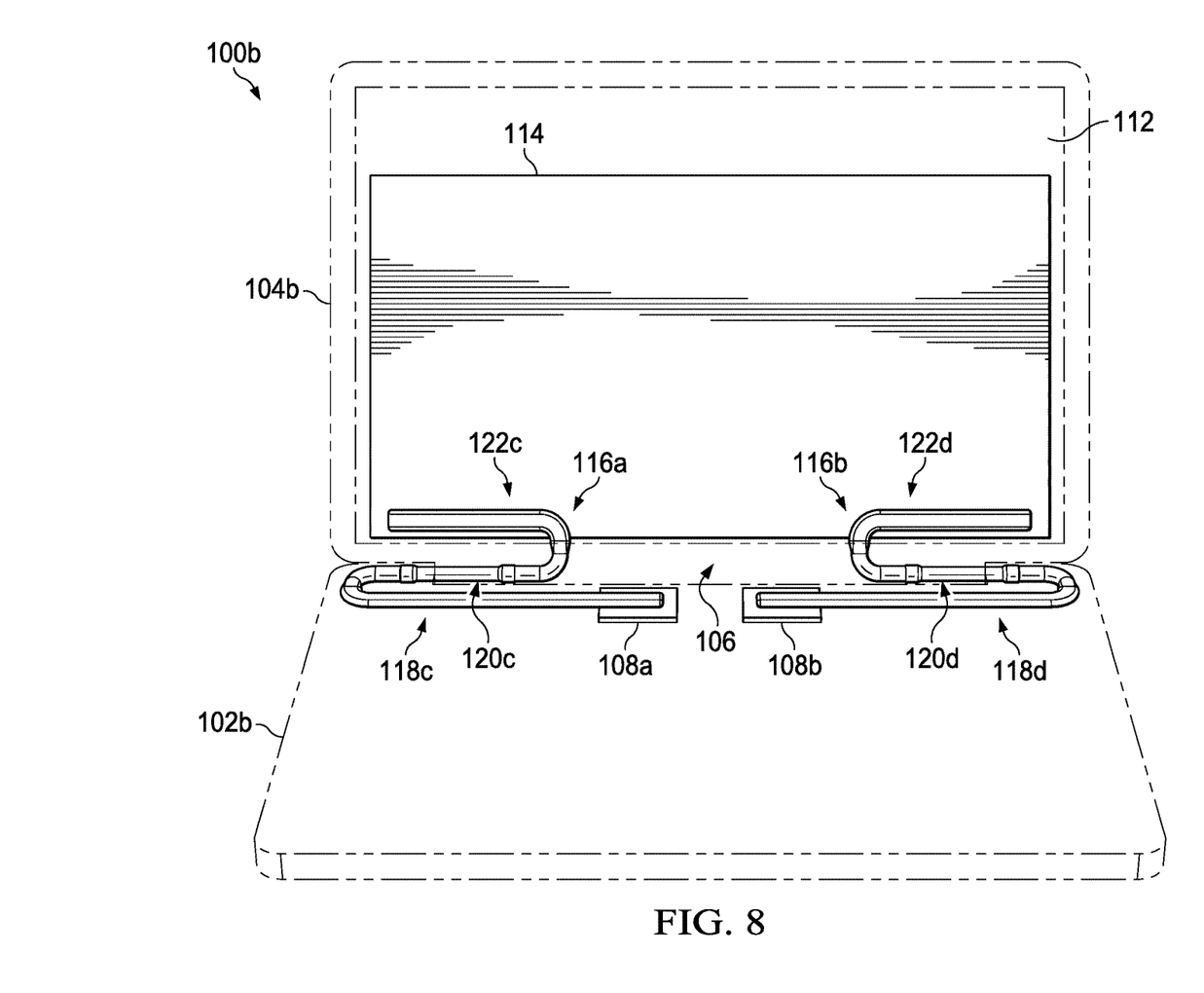
FIG. 8 is a simplified block diagram of a system to enable a torsional heat pipe, in accordance with an embodiment of the present disclosure.

Turning to FIG. 8, FIG. 8 is a simplified block diagram of a portion of an electronic device 100b that includes two heat sources 108a and 108b and two torsional heat pipes 116a and 116b respectively. First housing 102b can include heat sources 108a and 108b and first housing static portions 118c and 118d. Second housing 104b can include display 112, heat spreader 114, and second housing static portions 122c and 122d. Torsional heat pipe 116a can be associated with heat source 108a and torsional heat pipe 116b can be associated with heat source 108b. In an example, a first housing static portion 118c can extend from heat source 108a, to torsion portion 120c in hinge 106, to second housing static portion 122c, and to heat spreader 114. In addition, a first housing static portion 118d can extend from heat source 108b, to second torsion portion 120d in hinge 106, to second housing static portion 122d, and to heat spreader 114.

Figure 9:
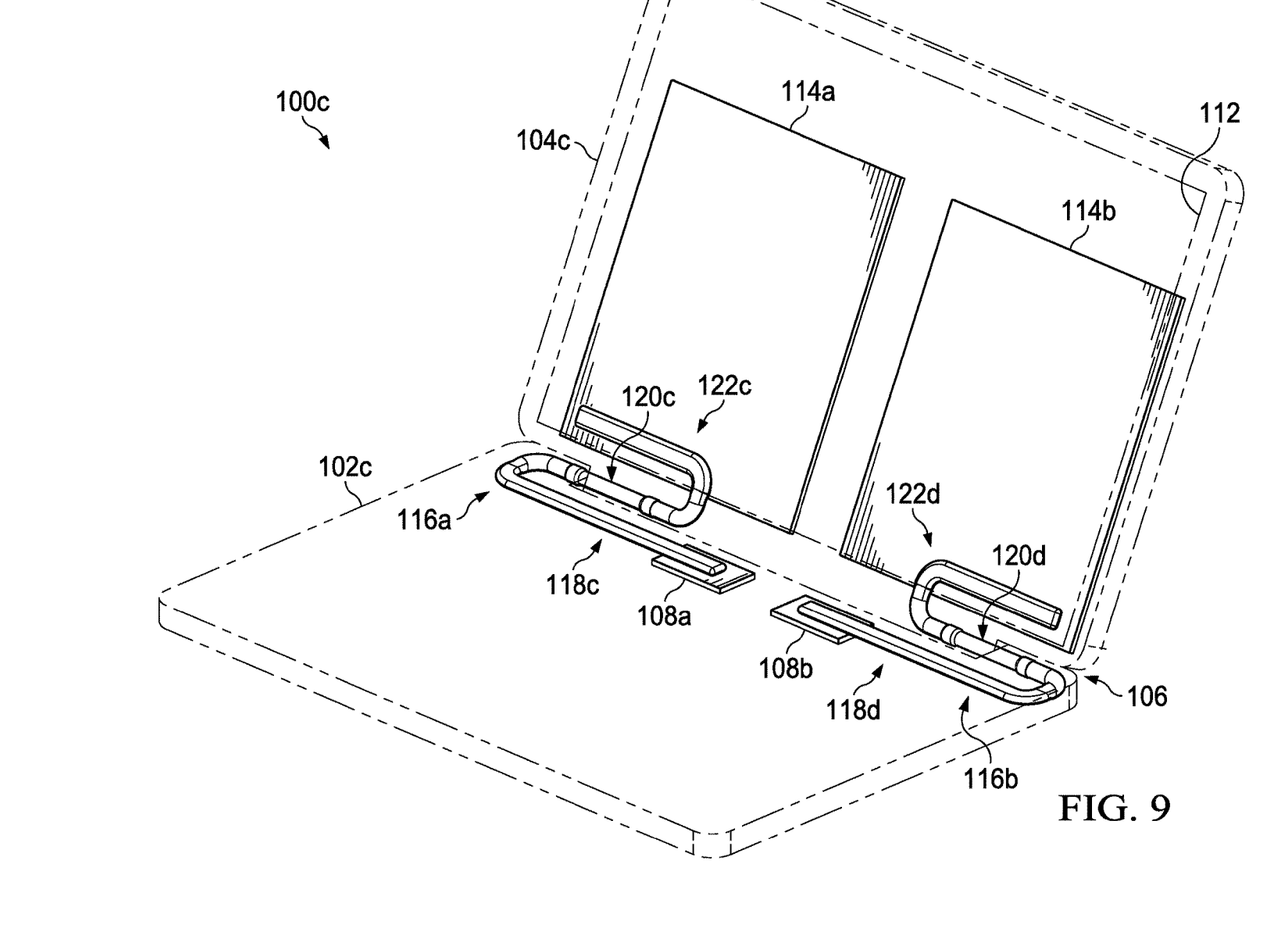
FIG. 9 is a simplified block diagram of a system to enable a torsional heat pipe, in accordance with an embodiment of the present disclosure.

Turning to FIG. 9, FIG. 9 is a simplified block diagram of a portion of an electronic device 100c that includes two heat sources 108a and 108b, two torsional heat pipes 116a and 116b, and two heat spreaders 114a and 114b respectively. First housing 102b can include heat sources 108a and 108b and first housing static portions 118c and 118d. Second housing 104b can include display 112, heat spreader 114, and second housing static portions 122c and 122d. Torsional heat pipe 116a can be associated with heat source 108a and torsional heat pipe 116b can be associated with heat source 108b. In an example, a first housing static portion 118c can extend from heat source 108a, to torsion portion 120c in hinge 106, to second housing static portion 122c, and to heat spreader 114a. In addition, a first housing static portion 118d can extend from heat source 108b, to second torsion portion 120d in hinge 106, to second housing static portion 122d, and to heat spreader 114b.

Figure 10:
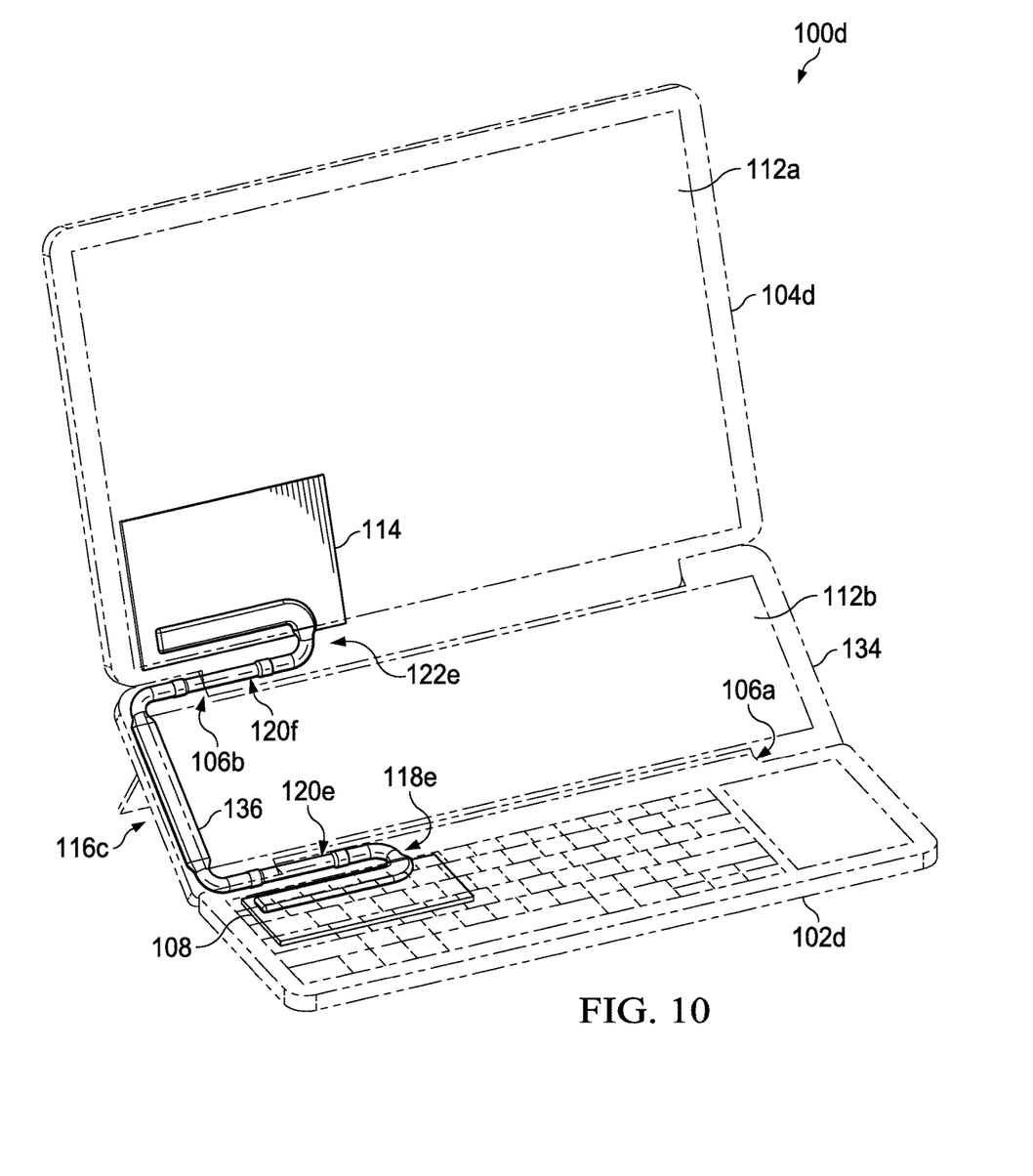
FIG. 10 is a simplified block diagram of a system to enable a torsional heat pipe, in accordance with an embodiment of the present disclosure.

Turning to FIG. 10, FIG. 10 is a simplified block diagram of a portion of an electronic device 100d. Electronic device 100d can include a first housing 102d, a second housing 104d, and a third housing 134. First housing 102d can be rotatably coupled to third housing 134 using first hinge 106a and second housing can be rotatably coupled to third housing 134 using second hinge 106b. First housing 102d can include heat source 108, and first housing static portion 118e of torsional heat pipe 116c. Second housing 104d can include a first display 112a, heat spreader 114, and second housing static portion 122e. Third housing 134 can include second display 112b and third housing static portion 136. In an example, first housing static portion 118e can extend from heat source 108, to first torsion portion 120e in first hinge 106a, to third housing static portion 136, to second torsion portion 120f in second hinge 106b, to second housing static portion 122e, and to heat spreader 114.

Figure 11:
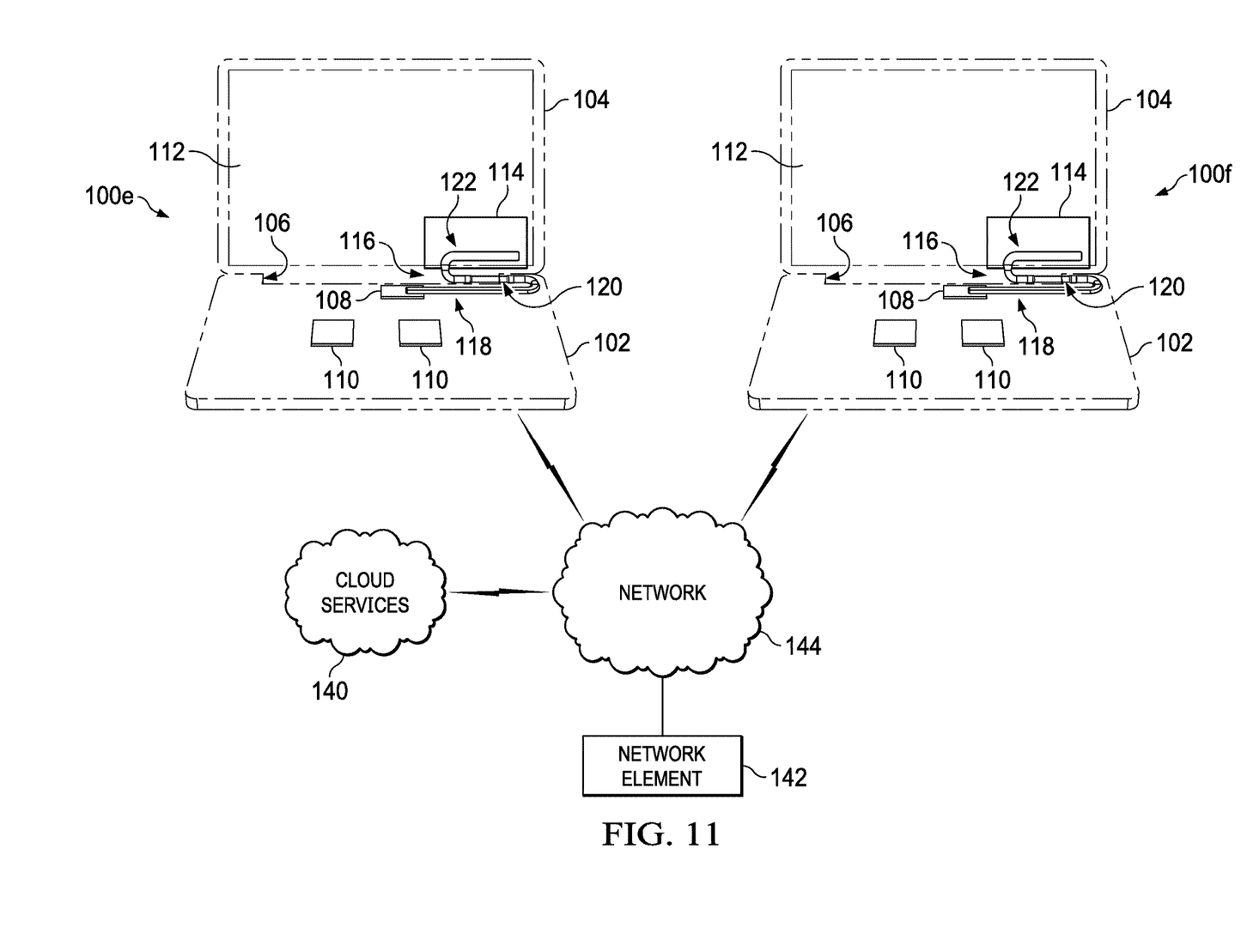
FIG. 11 is a simplified block diagram of a system to enable a torsional heat pipe, in accordance with an embodiment of the present disclosure.

Turning to FIG. 11, FIG. 11 is a simplified block diagram of electronic devices 100e and 100f configured to include a torsional heat pipe, in accordance with an embodiment of the present disclosure. Electronic devices 100e and 100f can each include first housing 102 and second housing 104. First housing 102 can be rotationally coupled to second housing 104 using hinge 106. First housing 102 can include heat source 108 and electronics 110. Second housing 104 can include display 112 and heat spreader 114. In an example, torsional heat pipe 116 can extend from heat source 108, through hinge 106, and to heat spreader 114. Torsional heat pipe 116 can include first housing static portion 118, torsion portion 120, and second housing static portion 122.

Each of electronic devices 100e and 100f may be in communication with each other, cloud services 140, and/or network element 142 using network 144. In some examples, one or more of electronic device 100e and 100f may be standalone devices and not connected to network 144 or another device. For example, as illustrated in FIG. 11, electronic device 100f is a standalone device and not connected to network 144.

Elements of FIG. 11 may be coupled to one another through one or more interfaces employing any suitable connections (wired or wireless), which provide viable pathways for network (e.g., network 144, etc.) communications. Additionally, any one or more of these elements of FIG. 11 may be combined or removed from the architecture based on particular configuration needs. Network 144 may include a configuration capable of transmission control protocol/Internet protocol (TCP/IP) communications for the transmission or reception of packets in a network. Each of electronic devices 100e and 100f may also operate in conjunction with a user datagram protocol/IP (UDP/IP) or any other suitable protocol where appropriate and based on particular needs.

Turning to the infrastructure of FIG. 11, network 144 represents a series of points or nodes of interconnected communication paths for receiving and transmitting packets of information. Network 144 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 144, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, InfiniBand, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although torsion heat pipes 116a-116c been illustrated with reference to particular elements and operations, these elements and operations may be replaced by any suitable architecture, protocols, and/or processes that achieve the intended functionality of torsion heat pipes 116a-116c.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, torsional heat pipe can include a first housing static portion located in a first housing of an electronic device, wherein the first housing static portion is coupled to a heat source, a second housing static portion located in a second housing of the electronic device, wherein the second housing static portion is coupled to a heat spreader, and a torsion portion located in a hinge of the electronic device, wherein the hinge rotatably couples the first housing to the second housing and the torsion portion rotates as the second housing rotates relative to the first housing, wherein the torsion portion couples the first housing static portion to the second housing static portion.

In Example A2, the subject matter of Example A1 can optionally include where the torsion portion is integrated into the hinge.

In Example A3, the subject matter of any one of Examples A1-A2 can optionally include where the torsional heat pipe is hermetically or quasi-hermetically sealed.

In Example A4, the subject matter of any one of Examples A1-A3 can optionally include a continuous vapor chamber that extends from the heat source in the first housing, through the torsion portion, and to the heat spreader in the second housing.

In Example A5, the subject matter of any one of Examples A1-A4 can optionally include where the torsional heat pipe allows for a 2-phase heat transfer from the heat source to the heat spreader.

In Example A6, the subject matter of any one of Examples A1-A5 can optionally include where the torsional heat pipe has an outside diameter between about two (2) millimeters to about twelve (12) millimeters.

In Example A7, the subject matter of any one of Examples A1-A6 can optionally include where the first housing is a base of a clamshell computer and the second housing includes a display of the clamshell computer.

Example AA1 is an electronic device including a heat source located in a first housing, a heat spreader located in a second housing, wherein the second housing is rotatably coupled to the first housing using a hinge, and a heat pipe, wherein the heat pipe extends from the heat source in the first housing, through the hinge, and to the heat spreader in the second housing, wherein the heat pipe includes a torsional portion that rotates as the second housing rotates relative to the first housing.

In Example AA2, the subject matter of Example AA1 can optionally include where the torsion portion is integrated into the hinge.

In Example AA3, the subject matter of any one of the Examples AA1-AA2 can optionally include where the heat pipe is hermetically or quasi-hermetically sealed.

In Example AA4, the subject matter of any one of the Examples AA1-AA3 can optionally include where the heat pipe includes a continuous vapor chamber that extends from the heat source in the first housing, through the torsional portion, and to the heat spreader in the second housing.

In Example AA5, the subject matter of any one of the Examples AA1-AA4 can optionally include where the heat pipe allows for a 2-phase heat transfer from the heat source to the heat spreader.

In Example AA6, the subject matter of any one of the Examples AA1-AA5 can optionally include where the heat pipe has an outside diameter between about two (2) millimeters to about twelve (12) millimeters.

In Example AA7, the subject matter of any one of the Examples AA1-AA6 can optionally include where wherein the electronic device is a clamshell computer.

Example M1 is a method including transferring heat from a heat source located in a first housing to a heat spreader located in a second housing using a heat pipe, wherein the second housing is rotatably coupled to the first housing using a hinge, wherein the heat pipe extends from the heat source in the first housing, through the hinge, and to the heat spreader in the second housing, wherein the heat pipe includes a torsional portion that rotates as the second housing rotates relative to the first housing.

In Example M2, the subject matter of Example M1 can optionally include where the torsion portion is integrated into the hinge.

In Example M3, the subject matter of any one of the Examples M1-M2 can optionally include where the heat pipe is hermetically or quasi-hermetically sealed.

In Example M4, the subject matter of any one of the Examples M1-M3 can optionally include where the heat pipe includes a continuous vapor chamber that extends from the heat source in the first housing, through the hinge, and to the heat spreader in the second housing.

In Example M5, the subject matter of any one of the Examples M1-M4 can optionally include where the heat pipe allows for a 2-phase heat transfer from the heat source to the heat spreader.

In Example M6, the subject matter of any one of the Examples M1-M5 can optionally include where the heat pipe has an outside diameter between about two (2) millimeters to about twelve (12) millimeters.

What is claimed is:

1. A torsional heat pipe comprising:
   a first housing static portion located in a first housing of an electronic device, wherein the first housing static portion is coupled to a heat source;
   a second housing static portion located in a second housing of the electronic device, wherein the second housing static portion has a first end and a second end wherein the first end, wherein the first end of the second housing static portion is coupled to a heat spreader;
   a torsion portion located in a hinge of the electronic device, wherein the hinge rotatably couples the first housing to the second housing, wherein the torsion portion couples the first housing static portion to the second housing static portion; and
   a flexible cover over the torsion portion, wherein the flexible cover has a first flared end that extends over a portion of the first housing static portion and a second flared end that extends over a portion of the second housing static portion, wherein the flexible cover, the first flared end, and the second flared end are made from an elastomer.

2. The torsional heat pipe of claim 1, wherein the torsion portion is integrated into the hinge.

3. The torsional heat pipe of claim 1, wherein the torsional heat pipe is hermetically or quasi-hermetically sealed.

4. The torsional heat pipe of claim 1, further comprising:
   a continuous vapor chamber that extends from the heat source in the first housing, through the torsion portion, and to the heat spreader in the second housing.

5. The torsional heat pipe of claim 1, wherein the torsional heat pipe allows for a 2-phase heat transfer from the heat source to the heat spreader.

6. The torsional heat pipe of claim 1, wherein the flexible cover, the first flared end, and the second flared end are a unitary structure.

7. An electronic device comprising:
   a heat source located in a first housing;
   a heat spreader located in a second housing, wherein the second housing is rotatably coupled to the first housing using a hinge; and
   a heat pipe, wherein the heat pipe extends from the heat source in the first housing, through the hinge, and to the heat spreader in the second housing, wherein the heat pipe includes:
   a torsional portion that rotates as the second housing rotates relative to the first housing;
   a first portion that extends from the heat source to the torsion portion; and
   a second portion that extends from the torsion portion to the heat spreader, wherein the second portion has a first end and a second end wherein the torsional portion has a first flared end, wherein the torsional portion has a first flared end that extends over a portion of the first portion that extends from the heat source and a second flared end that extends over a portion of the second portion that extends to the heat spreader, wherein the torsion portion, the first flared end, and the second flared end are made from an elastomer.

8. The electronic device of claim 7, wherein the torsion portion is integrated into the hinge.

9. The electronic device of claim 7, wherein the heat pipe is hermetically or quasi-hermetically sealed.

10. The electronic device of claim 7, wherein the heat pipe includes a continuous vapor chamber that extends from the heat source in the first housing, through the torsional portion, and to the heat spreader in the second housing.

11. The electronic device of claim 7, wherein the heat pipe allows for a 2-phase heat transfer from the heat source to the heat spreader.

12. The electronic device of claim 7, wherein the heat pipe has an outside diameter between about two (2) millimeters to about twelve (12) millimeters.

13. The electronic device of claim 7, wherein the electronic device is a clamshell computer.

14. The electronic device of claim 7, wherein the torsion portion, the first flared end, and the second flared end are a unitary structure.

15. A method comprising:
    transferring heat from a heat source located in a first housing to a heat spreader located in a second housing using a heat pipe, wherein the second housing is rotatably coupled to the first housing using a hinge, wherein the heat pipe extends from the heat source in the first housing, through the hinge, and to the heat spreader in the second housing, wherein the heat pipe includes:
    a torsional portion;
    a first portion that extends from the heat source to the torsion portion;
    a second portion that extends from the torsion portion to the heat spreader, wherein the second portion has a first end and a second end wherein the torsional portion has a first flared end, wherein the torsional portion has a first flared end that extends over a portion of the first portion that extends from the heat source and a second flared end that extends over a portion of the second portion that extends to the heat spreader, wherein the torsion portion, the first flared end, and the second flared end are made from an elastomer; and
    a wick that extends from at least a portion of the heat pipe in the first housing, through the hinge, and to at least a portion of the heat pipe in the second housing.

16. The method of claim 15, wherein the torsion portion is integrated into the hinge.

17. The method of claim 15, wherein the heat pipe is hermetically or quasi-hermetically sealed.

18. The method of claim 15, wherein the heat pipe includes a continuous vapor chamber that extends from the heat source in the first housing, through the hinge, and to the heat spreader in the second housing.

19. The method of claim 15, wherein the heat pipe allows for a 2-phase heat transfer from the heat source to the heat spreader.

20. The method of claim 15, wherein the heat pipe has an outside diameter between about two (2) millimeters to about twelve (12) millimeters.

* * * * *

UNITED STATES PATENT AND TRADEMARK OFFICE
CERTIFICATE OF CORRECTION

PATENT NO. : 10,932,393 B2
APPLICATION NO. : 16/370918
DATED : February 23, 2021
INVENTOR(S) : Juha Tapani Paavola et al.

It is certified that error appears in the above-identified patent and that said Letters Patent is hereby corrected as shown below:

In the Claims

In Column 13, Lines 16-17, in Claim 1, delete "end wherein the first end," and insert -- end, --, therefor.

In Column 13, Line 60-61, in Claim 7, delete "end wherein the torsional portion has a first flared end," and insert -- end, --, therefor.

In Column 14, Line 38-39, in Claim 15, delete "end wherein the torsional portion has a first flared end," and insert -- end, --, therefor.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*